(12) United States Patent
Cho et al.

(10) Patent No.: US 8,481,998 B2
(45) Date of Patent: Jul. 9, 2013

(54) DISPLAY DEVICE AND METHOD FOR MANUFACTURING THE SAME

(75) Inventors: Kyu-Sik Cho, Yongin (KR); Joon-Hoo Choi, Yongin (KR); Bo-Kyung Choi, Yongin (KR); Sang-Ho Moon, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 66 days.

(21) Appl. No.: 13/098,343

(22) Filed: Apr. 29, 2011

(65) Prior Publication Data

US 2011/0303922 A1    Dec. 15, 2011

(30) Foreign Application Priority Data

Jun. 9, 2010    (KR) .................. 10-2010-0054407

(51) Int. Cl.
*H01L 29/786*    (2006.01)
*H01L 21/283*    (2006.01)

(52) U.S. Cl.
USPC    257/40; 257/100; 257/E29.273; 257/E21.159; 438/134

(58) Field of Classification Search
None
See application file for complete search history.

(56) References Cited

U.S. PATENT DOCUMENTS

| | | | | |
|---|---|---|---|---|
| 6,992,332 | B2 * | 1/2006 | Yamazaki et al. | 257/83 |
| 7,671,369 | B2 * | 3/2010 | Yamazaki et al. | 257/59 |
| 2001/0025958 | A1 * | 10/2001 | Yamazaki et al. | 257/72 |
| 2009/0251048 | A1 * | 10/2009 | Choi et al. | 313/504 |
| 2009/0267074 | A1 * | 10/2009 | Kwon et al. | 257/72 |

FOREIGN PATENT DOCUMENTS

| | | |
|---|---|---|
| JP | 2003-197367 | 7/2003 |
| JP | 2007-027773 | 2/2007 |
| KR | 2000-0009436 A | 2/2000 |
| KR | 2001-0082851 A | 8/2001 |
| KR | 10-2002-0074897 | 10/2002 |
| KR | 20030082385 A | 10/2003 |
| KR | 20030089447 A | 11/2003 |
| KR | 10-0543029 * | 5/2006 |
| KR | 10-2006-0073531 | 6/2006 |
| KR | 10-2008-0031090 | 4/2008 |
| KR | 10-0908236 | 7/2009 |

* cited by examiner

*Primary Examiner* — Thomas L Dickey
*Assistant Examiner* — Joseph Schoenholtz
(74) *Attorney, Agent, or Firm* — Robert E. Bushnell, Esq.

(57) ABSTRACT

A display device and a manufacturing method thereof are provided. The display device includes a substrate, a semiconductor layer formed on the substrate, an organic insulating layer formed on the semiconductor layer, a plurality of conductive wires formed on the organic insulating layer. The organic insulating layer has an open groove that is formed between the conductive wires.

24 Claims, 11 Drawing Sheets

DISPLAY DEVICE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 9 Jun. 2010 and there duly assigned Serial No. 10-2010-0054407.

BACKGROUND OF THE INVENTION

1. Field of the Invention

The described technology relates generally to a display device and a manufacturing method thereof. More particularly, the described technology relates generally to a display device and a manufacturing method thereof for improving the performance of the display device and suppressing the generation of defects in the display device.

2. Description of the Related Art

Most flat panel display devices such as organic light emitting diode (OLED) displays and liquid crystal displays (LCDs) use an organic insulating layer with a thin film transistor.

The organic insulating layer is exposed to many etching processes when contact holes are formed or conductive layers are patterned. However, the surface roughness of the organic insulating layer remarkably increases when the organic insulating layer is exposed to an etching process, particularly a dry etching process. If a conductive layer is formed on the organic insulating layer with increased surface roughness and patterned, the conductive material of the conductive layer is easily left on the surface of the organic insulating layer. The conductive material left on the organic insulating layer blocks conductive wires from being electrically insulated from each other so as to cause a short-circuit.

The above information disclosed in this Background section is only for enhancement of understanding of the background of the described technology and therefore it may contain information that does not form the prior art that is already known in this country to a person of ordinary skill in the art.

SUMMARY OF THE INVENTION

An exemplary embodiment provides a display device for preventing an internal short-circuit.

Another exemplary embodiment provides a method for manufacturing the display device.

According to an exemplary embodiment, the display device includes a substrate, a semiconductor layer formed on the substrate, an organic insulating layer formed on the semiconductor layer, and a plurality of conductive wires formed on the organic insulating layer. The organic insulating layer has an open groove, and the open groove is formed between the conductive wires.

The plurality of conductive wires may be disposed apart from each other having the open groove formed therebetween.

The display device may further include a gate insulating layer formed on the semiconductor layer, and a gate electrode formed on the gate insulating layer.

The display device may further include an inorganic insulating layer disposed between the organic insulating layer and the gate electrode.

The inorganic insulating layer may have an open groove. The open groove of the organic insulating layer and the open groove of the inorganic insulating layer may be aligned together to expose the gate insulating layer or the gate electrodes.

The inorganic insulating layer may include a silicon nitride film containing hydrogen.

The semiconductor layer may be formed by patterning a polysilicon layer.

The plurality of conductive wires may include a source electrode and a drain electrode.

The display device may further include a first capacitor electrode formed on the substrate and a second capacitor electrode formed on the gate insulating layer. The first capacitor electrode may be substantially at the same level as the semiconductor layer. The second capacitor electrode may be formed substantially at on the same level as the source electrode and the drain electrode.

The display device may further include a pixel electrode formed on the gate insulating layer, an organic emission layer formed on the pixel electrode, and a common electrode formed on the organic emission layer. The pixel electrode may be coupled to a drain region of the semiconductor layer.

The gate electrode may be formed in a double-layer structure including a gate transparent layer and a gate metal layer formed on the gate transparent layer.

The pixel electrode may be formed of the same material as the gate transparent layer of the gate electrode on the same level as the gate transparent layer.

The display device may further include a pixel electrode formed on the gate insulating layer, a liquid crystal layer formed on the pixel electrode, and a common electrode formed on the liquid crystal layer. The pixel electrode may be coupled to a drain region of the semiconductor layer.

According to another exemplary embodiment, the method for manufacturing the display device includes preparing a substrate, forming a semiconductor layer on the substrate, forming an organic insulating layer on the semiconductor layer, forming an open groove on the organic insulating layer, and forming a plurality of conductive wires on the organic insulating layer. The plurality of conductive wires are disposed apart from each other having the open groove formed between the conductive wires.

The manufacturing method may further include forming a gate insulating layer on the semiconductor layer and forming a gate electrode on the gate insulating layer. The organic insulating layer is formed on the gate electrode.

The plurality of conductive wires may include a source electrode and a drain electrode.

The manufacturing method may further include forming a first capacitor electrode the substrate substantially at the same level as the semiconductor layer, and the conductive wires include a second capacitor electrode formed substantially at the same level as the source electrode and the drain electrode.

The manufacturing method may further include forming an inorganic insulating layer between the gate electrode and the organic insulating layer.

The forming the open groove on the organic insulating layer may further include forming a contact hole on each of the organic insulating layer, the inorganic insulating layer, and the gate insulating layer. The contact holes of the organic insulating layer, the inorganic insulating layer, and the gate insulating layer may be aligned together to expose a portion of the semiconductor layer.

The forming the contact hole on each of the organic insulating layer, the inorganic insulating layer, and the gate insulating layer may further include removing portions of the organic insulating layer and the inorganic insulating layer, at which the plurality of contact holes will be formed, removing parts of portions of the organic insulating layer in which the open groove will be formed through photolithography using halftone exposure, removing portions of the gate insulating layer at which the plurality of contact holes will be formed through an etching process to expose the semiconductor layer, and removing portions of the organic insulating layer that are left in the regions where the open groove will be formed.

The forming the open groove may include patterning the organic insulating layer and the inorganic insulating layer together.

The inorganic insulating layer may include at least one of a silicon nitride film and a silicon oxide film.

The inorganic insulating layer may include a silicon nitride film formed through plasma enhanced chemical vapor deposition (PECVD) using silane, ammonia, and hydrogen.

The manufacturing method may further include annealing after the inorganic insulating layer is formed on the gate electrode.

The annealing may include heat treatment performed at a temperature higher than 250° C.

According to exemplary embodiments, the display device can prevent an internal short-circuit.

Furthermore, the semiconductor layer of the thin film transistor used for the display device can be effectively annealed.

Moreover, the display device can be effectively manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Most flat panel display devices such as organic light emitting diode (OLED) displays and liquid crystal displays (LCDs) use an organic insulating layer with a thin film transistor. The organic insulating layer is exposed to many etching processes when contact holes are formed or conductive layers are patterned. However, the surface roughness of the organic insulating layer remarkably increases when the organic insulating layer is exposed to an etching process, particularly a dry etching process. If a conductive layer is formed on the organic insulating layer with increased surface roughness and patterned, the conductive material of the conductive layer is easily left on the surface of the organic insulating layer. The conductive material left on the organic insulating layer blocks conductive wires from being electrically insulated from each other so as to cause a short-circuit.

The present invention will be described more fully hereinafter with reference to the accompanying drawings, in which exemplary embodiments of the invention are shown. The described embodiments may be modified in various different ways, all without departing from the spirit or scope of the present invention. Like reference numerals designate like elements throughout the specification. Exemplary embodiments other than the first exemplary embodiment are described on configurations different from those of the first exemplary embodiment.

The sizes and thicknesses of elements are represented for better understanding and ease of description in the drawings, and the present invention is not limited thereto. In the drawings, the thicknesses of layers and regions are magnified for clarity. In addition, the thicknesses of some layers and regions are exaggerated for ease of description. It will be understood that when an element such as a layer, film, region, or substrate is referred to as being "on" another element, it can be directly on the other element or intervening elements may also be present.

Figure 1:
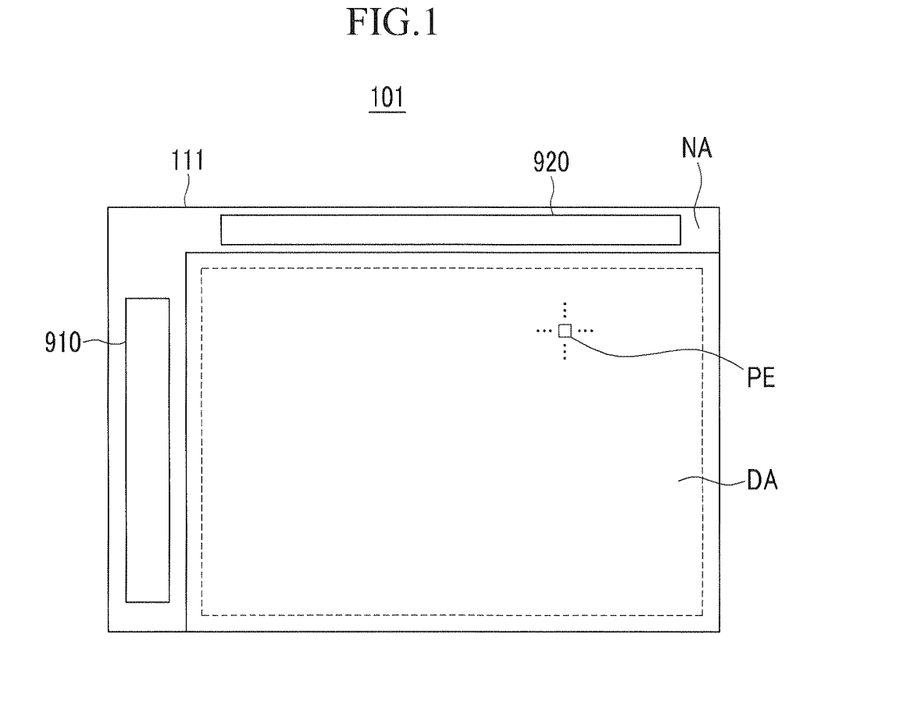
FIG. 1 is a top plan view roughly showing the structure of a display device according to a first exemplary embodiment.

A display device 101 according to a first exemplary embodiment will now be explained with reference to FIGS. 1, 2, and 3. As shown in FIG. 1, the display device 101 includes a substrate 111 divided into a display area DA and a non-display area NA. A plurality of pixel areas PE are arranged in the display area DA of the substrate 111 to display images, and one or more driving circuits 910 and 920 are formed on the non-display area NA. Here, the pixel area PE represents a region where a pixel, a minimum unit that displays an image, is formed. In the first exemplary embodiment. There is no need to form both the driving circuits 910 and 920 in the non-display area NA, and both or one of the driving circuits 910 and 920 may be omitted.

Figure 2:
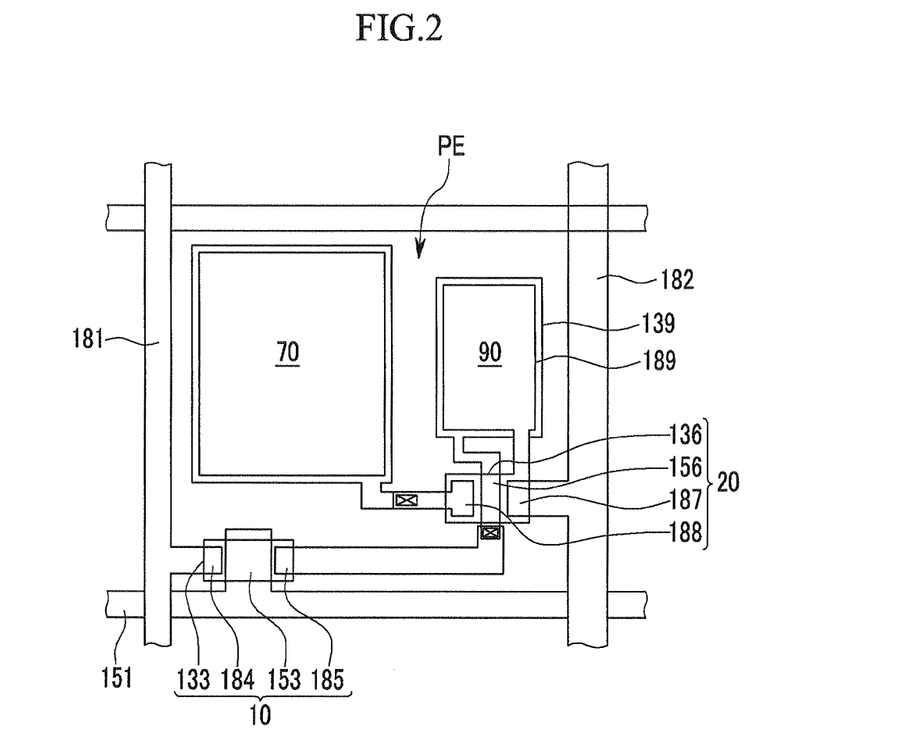
FIG. 2 is a layout view showing a pixel area of the display device shown in FIG. 1.

As shown in FIG. 2, the display device 101 according to the first exemplary embodiment is an organic light emitting diode (OLED) display having a two-transistor-one-capacitor (2Tr-1Cap) structure in which a single OLED 70, two thin film transistors 10 and 20, and a single capacitor 90 are arranged in each pixel area PE. However, the first exemplary embodiment is not limited thereto. Accordingly, the display device 101 may be an OLED display having a structure in which at least three thin film transistors and at least two capacitors are arranged in each pixel area PE. Furthermore, the display device 101 may include additional connecting lines such that the display device 101 has various structures. At least one of additionally formed thin film transistors and capacitors may construct a compensation circuit.

A compensation circuit improves uniformity of the OLEDs 70 formed in the pixel areas PE so as to suppress image quality deviation. The compensation circuit may include two to eight thin film transistors.

The driving circuits 910 and 920 (shown in FIG. 1) formed on the non-display area NA of the substrate 111 may respectively include additional thin film transistors.

The OLED 70 includes an anode that is a hole injection electrode, a cathode that is an electron injection electrode, and an organic emission layer arranged between the anode and the cathode.

Specifically, in the first exemplary embodiment, the display device 101 includes a first thin film transistor 10 and a second thin film transistor 20 formed in each pixel area PE. The first thin film transistor 10 and the second thin film transistor 20 respectively include gate electrodes 153 and 156, semiconductor layers 133 and 136, source electrodes 184 and 187, and drain electrodes 185 and 188.

In addition, a gate line 151, a data line 181, and a common power line 182 are formed on the substrate 111. The single pixel area PE may be defined as an area surrounded by the gate line 151, the data line 181, and the common power line 182. However, the pixel area PE is not limited thereto. A capacitor line may be additionally formed on the substrate 111.

The source electrode 184 of the first thin film transistor 10 is connected to the data line 181, and the gate electrode 153 of the first thin film transistor 10 is connected to the gate line 151. A node is formed between the drain electrode 185 of the first thin film transistor 10 and the capacitor 90 such that the drain electrode 185 of the first thin film transistor 10 is connected to a first capacitor electrode 139 of the capacitor 90. Furthermore, the drain electrode 185 of the first thin film transistor 10 is connected to the gate electrode 156 of the second thin film transistor 20. The common power line 182 is connected to the source electrode 187 of the second thin film transistor 20 and the anode of the OLED 70 is connected to the drain electrode 188 of the second thin film transistor 20. Hereinafter, the anode of the OLED 70 is referred to as a pixel electrode and the cathode thereof is referred to as a common electrode. The positions of the anode and the cathode may be changed with each other.

The first thin film transistor 10 is used as a switching element that selects a pixel area PE that will emit light. When the first thin film transistor 10 is instantaneously turned on, the capacitor 90 is charged with charges, and the quantity of the charges charged in the capacitor 90 is proportional to a voltage supplied from the data line 181. The gate voltage of the second thin film transistor 20 increases with the voltage of the charged capacitor 90 while the first thin film transistor 10 is turned off. The second thin film transistor 20 is turned on when the gate voltage thereof exceeds a threshold voltage. Then, a voltage applied to the common power line 182 is supplied to the OLED 70 through the second thin film transistor 20, and thus the OLED 70 emits light.

The configuration of the pixel area PE is not limited to the above description, and various changes can be made.

The structures of the thin film transistors 10 and 20, the OLED 70, and the capacitor 90 according to the first exemplary embodiment will now be explained in detail according to the laminating order shown in FIG. 3.

The substrate 111 is a transparent insulating substrate made of glass, quartz, ceramic, or plastic. However, the first exemplary embodiment is not limited thereto, and the substrate 111 may be a metallic substrate made of stainless steel. Furthermore, when the substrate 111 is made of plastic, a flexible substrate may be used as the substrate 111.

A buffer layer 120 is formed on the substrate 111. The buffer layer 120 is formed in a single-layer or multi-layer structure including at least one insulating layer such as a silicon oxide layer and a silicon nitride layer formed by chemical vapor deposition or physical vapor deposition. The buffer layer 120 prevents diffusion or infiltration of moisture or impurities generated in the substrate 111, planarizes the surface of the substrate 111, and controls a heat transfer speed during a crystallization process for forming a semiconductor layer such that crystallization is satisfactorily performed. The buffer layer 120 may be omitted according to the type of substrate 111 and process conditions.

The semiconductor layers 133 and 136 and the first capacitor electrode 139 are formed on the buffer layer 120. The semiconductor layers 133 and 136 and the first capacitor electrode 139 are formed by forming an amorphous silicon layer on the buffer layer 120, crystallizing the amorphous silicon layer to form a polysilicon layer, and patterning the polysilicon layer. However, the first exemplary embodiment is not limited thereto. The first capacitor electrode 139 may be formed of a different material from that of the semiconductor layers 133 and 136 according to circumstances.

A gate insulating layer 140 is formed on the semiconductor layers 133 and 136 and the first capacitor electrode 139. Specifically, the gate insulating layer 140 is formed on the buffer layer 120 to cover the semiconductor layers 133 and 136 and the first capacitor electrode 139. The gate insulating layer 140 is formed of at least one of various known insulating materials including tetraethylorthosilicate (TEOS), SiNx, and $SiO_2$.

The gate electrodes 153 and 156 and a pixel electrode 710 are formed on the gate insulating layer 140. The gate electrodes 153 and 156 are respectively formed on the semiconductor layers 133 and 136, and specifically are formed on channel regions 1333 and 1366 of the semiconductor layers 133 and 136, respectively. The semiconductor layers 133 and 136 are respectively divided into the channel regions 1333 and 1366 that are not doped with an impurity, and source regions 1334 and 1367 and drain regions 1335 and 1368, which are disposed on one side and another side of the channel regions 1333 and 1366, respectively. The source regions 1334 and 1367 and drain regions 1335 and 1368 and doped with an impurity. The gate electrodes 153 and 156 respectively block the channel regions 1333 and 1366 from being doped with an impurity when the impurity is doped into the semiconductor layers 133 and 136 to form the source regions 1334 and 1367 and the drain regions 1335 and 1368. Furthermore, the impurity may be doped into the first capacitor electrode 139 when the impurity is doped into the source regions 1334 and 1367 and the drain regions 1335 and 1368 of the semiconductor layers 133 and 136.

The gate electrodes 153 and 156 are formed in a double-layer structure including a gate transparent layer and a gate metal layer formed on the gate transparent layer. The gate metal layer includes at least one of various known metallic materials such as molybdenum (Mo), chromium (Cr), aluminum (Al), silver (Ag), titanium (Ti), tantalum (Ta), and tungsten (W). The gate transparent layer includes at least one of transparent conductive layers such as indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The pixel electrode 710 is formed of the same material as the gate transparent layer of the gate electrodes 153 and 156, and, is formed on substantially the same level as the gate transparent layer.

An inorganic insulating layer 160 is formed on the gate electrodes 153 and 156. The inorganic insulating layer 160 includes at least one of a silicon nitride film and a silicon oxide film. That is, the inorganic insulating layer 160 may be formed in a single layer structure including the silicon nitride film or silicon oxide layer, or in a multi-layer structure including both the silicon nitride film and the silicon oxide film. In addition, the inorganic insulating layer 160 may contain hydrogen. Particularly, the silicon nitride film can easily contain hydrogen in terms of process conditions. The inorganic insulating layer 160 can execute a function of providing hydrogen to the semiconductor layers 133 and 136 during annealing of the semiconductor layers 133 and 136 to achieve smooth annealing, in addition to having an insulating function.

However, the first exemplary embodiment is not limited thereto. Accordingly, the inorganic insulating layer 160 may be omitted. That is, an organic insulating layer 170, which will be described layer, may be directly formed on the gate electrodes 153 and 156.

Furthermore, the inorganic insulating layer 160 is not formed on the pixel electrode 710. That is, the inorganic insulating layer 160 is formed such that the inorganic insulating layer exposes the pixel electrode 710.

The organic insulating layer 170 is formed on the inorganic insulating layer 160. It is easy to form the inorganic insulating layer 170 thicker as compared to the inorganic insulating layer 160. Accordingly, the organic insulating layer 170 can be formed sufficiently thick to secure stable interlayer insulation. For example, the organic insulating layer 170 can have a thickness of approximately 3 μm.

Like the inorganic insulating layer 160, the organic insulating layer 170 is not formed on the pixel electrode 710. That is, the organic insulating layer 170 is formed such that the organic insulating layer 170 exposes the pixel electrode 710.

An open groove 7080 is formed in the organic insulating layer 170. In the first exemplary embodiment, the open groove 7080 is formed in the organic insulating layer 170 and exposes the inorganic insulating layer 160 disposed under the organic insulating layer 170. As shown in FIG. 3, some of the open grooves 7080 overlap with gate electrode 153 or 156, and expose a portion of the inorganic insulating layer 160 disposed on the gate electrode 153.

Furthermore, the organic insulating layer 170, the inorganic insulating layer 160, and the gate insulating layer 140 have a plurality of contact holes 7644, 7645, 7647, and 7648 which selectively expose the semiconductor layers 133 and 136. The plurality of contact holes 7644, 7645, 7647, and 7648 expose parts of the source regions 1334 and 1367 and the drain regions 1335 and 1368 of the semiconductor layers 133 and 136.

In addition, the organic insulating layer 170 has a capacitor opening 7090 formed on the first capacitor electrode 139. The capacitor opening 7090 prevents the distance between the first capacitor electrode 139 and a second capacitor electrode 189 from excessively increasing to deteriorate the capacitance of the capacitor 90.

A plurality of conductive wires 184, 185, 187, 188, and 189 are formed on the organic insulating layer 170. The plurality of conductive wires includes the source electrodes 184 and 187, the drain electrodes 185 and 188, and the second capacitor electrode 189. In other words, some of the conductive wires function as the source electrodes coupled to the source regions 1334 of the semiconductor layer 133 or coupled to the source regions 1367 of the semiconductor layer 136, and another some of the conductive wires function as the drain electrodes coupled to the drain regions 1335 of the semiconductor layer 133 or coupled to the drain regions 1368 of the semiconductor layer 136. The second capacitor electrode 189 may be regarded as one of the conductive wires. The plurality of conductive wires may further include the data line 181 (shown in FIG. 2) and the common power line 182 (shown in FIG. 2).

Like the gate electrodes 153 and 156, the plurality of conductive wires 184, 185, 187, 188, and 189 may be formed of at least one of various known metallic materials.

The source electrodes 184 and 187 and the drain electrodes 185 and 188 respectively come into contact with the source regions 1334 and 1367 and the drain regions 1335 and 1368 of the semiconductor layers 133 and 135 through the contact holes 7644, 7645, 7647, and 7648, respectively.

Although the second capacitor electrode 189 is formed on substantially the same level as the source electrodes 184 and 187 and the drain electrodes 185 and 188, the first exemplary embodiment is not limited thereto. Accordingly, the second capacitor electrode 189 may be formed on the same level as the gate electrodes 153 and 156.

The open groove 7080 is formed between the plurality of conductive wires 184, 185, 187, 188, and 189. That is, the plurality of conductive wires 184, 185, 187, 188, and 189 are disposed apart from each other having the open groove 7080 formed therebetween. In this manner, the open groove 7080 surrounds the plurality of conductive wires 184, 185, 187, 188, and 189, and thus the conductive wires 184, 185, 187, 188, and 189 can be stably insulated. That is, even if a conductive material for forming the conductive wires 184, 185, 187, 188, and 189 is unnecessarily left on the organic insulating layer 170 during a process of patterning the conductive wires 184, 185, 187, 188, and 189, the open groove 7080 can prevent the conductive wires 184, 185, 187, 188, and 189 from short-circuiting.

A pixel-defining layer 190 is formed on the plurality of conductive wires 184, 185, 187, 188, and 189. The pixel-defining layer 190 includes a pixel opening 195 that selectively exposes part of the pixel electrode 710. The pixel-defining layer 190 may be formed of various known organic or inorganic materials. For example, the pixel-defining layer 190 may be formed by patterning a photosensitive organic layer and thermally or optically baking the patterned photosensitive organic layer.

An organic emission layer 720 is formed on the pixel electrode 710, and a common electrode 730 is formed on the organic emission layer 720. The pixel electrode 710, the organic emission layer 720, and the common electrode 730 form the organic light emitting diode (OLED) 70. The pixel opening 195 of the pixel-defining layer 190, in which the pixel electrode 710, the organic emission layer 720, and the common electrode 730 are sequentially formed, becomes a light-emitting region of the OLED 70.

According to this configuration, the display device 101 according to the first exemplary embodiment can stably prevent an internal short-circuit. Furthermore, the semiconductor layers 133 and 136 of the thin film transistors 10 and 20 used for the display device 101 can be effectively annealed.

A method for manufacturing the display device 101 according to the first exemplary embodiment will now be explained with reference to FIGS. 4 through 9.

Figure 4:
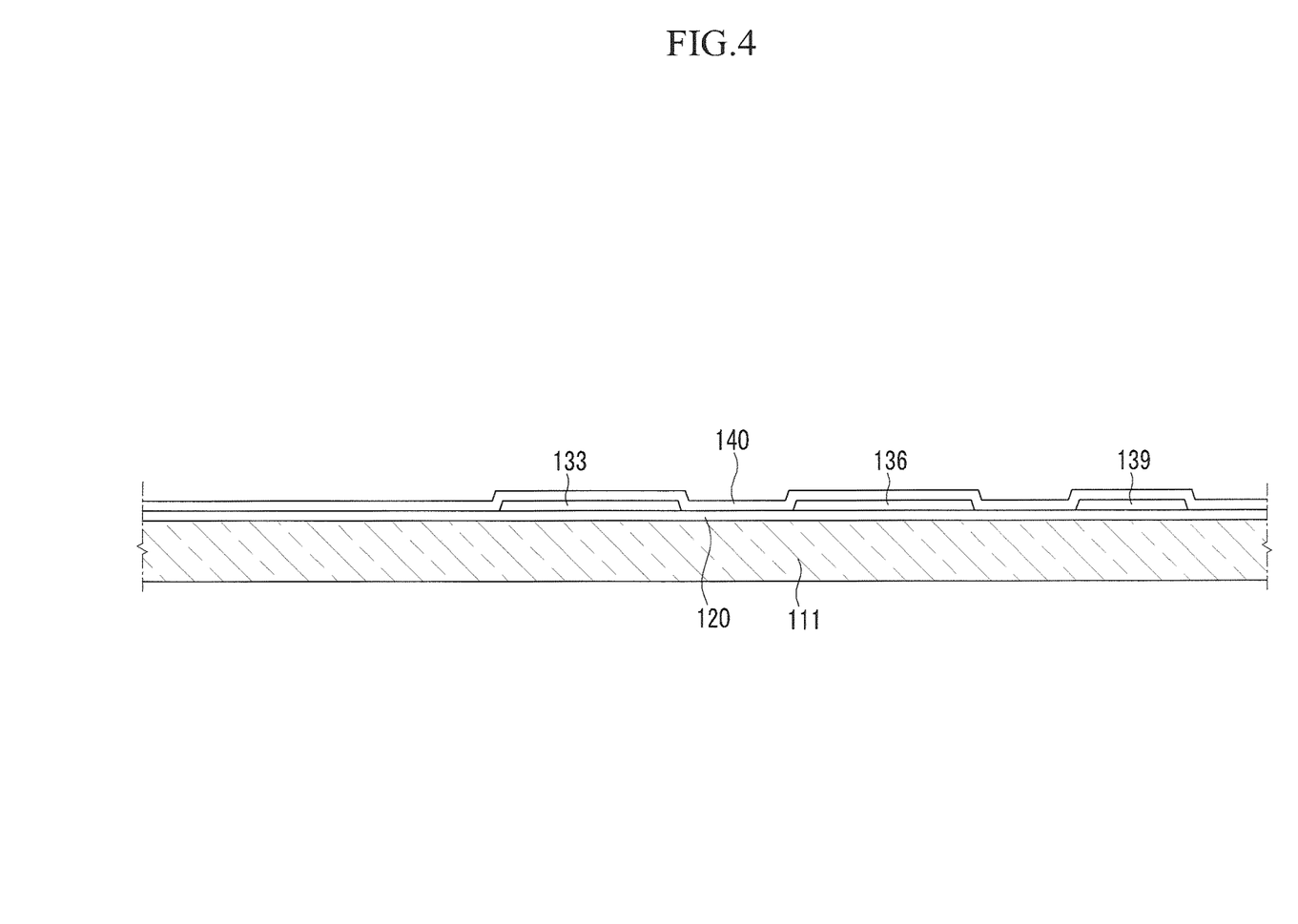
FIGS. 4 through 9 are cross-sectional views sequentially showing a process of manufacturing the display device shown in FIG. 2.

As shown in FIG. 4, the buffer layer 120 is formed on the substrate 111. The buffer layer 120 may be formed as a single-layer structure including a silicon nitride film or as a double-layer structure, in which a silicon nitride film and a silicon oxide film are laminated.

The semiconductor layers 133 and 136 and the first capacitor electrode 139 are formed on the buffer layer 120 (S110). The semiconductor layers 133 and 136 may be formed by depositing amorphous silicon on the buffer layer 120, crystallizing the amorphous silicon layer to form a polysilicon layer, and patterning the polysilicon layer.

The amorphous silicon layer is crystallized using various known crystallization methods including solid phase crystallization, excimer laser crystallization), metal induced crystallization (MIC), metal induced lateral crystallization (MILC), and super grain silicon (SGS) crystallization.

The gate insulating layer 140 covering the semiconductor layers 133 and 136 and the first capacitor electrode 139 is formed (S120). The gate transparent layer and the gate metal layer are sequentially formed on the gate insulating layer 140.

Figure 5:
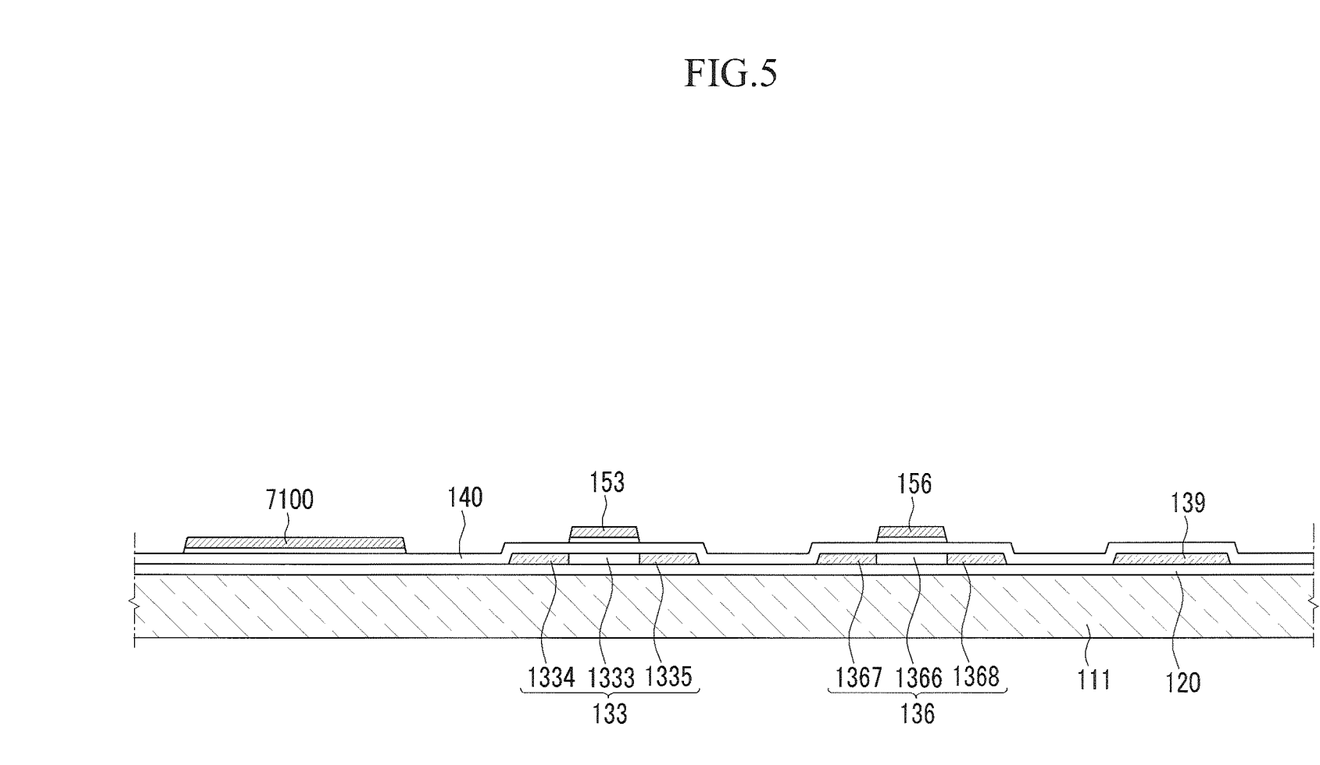

As shown in FIG. 5, the gate transparent layer and the gate metal layer are patterned to form the gate electrodes 153 and 156 and a pixel electrode intermediate body 7100 (S130). That is, the gate electrodes 153 and 156 and the pixel electrode intermediate body 7100 are formed in a double-layer structure.

Subsequently, an impurity is doped into the semiconductor layers 133 and 136. Here, the semiconductor layers 133 and 136 are respectively divided into the undoped channel regions 1333 and 1366, and doped source regions 1334 and 1367 and drain regions 1335 and 1368. During the doping process, the gate electrodes 153 and 156 block the channel regions 1333 and 1366 of the semiconductor layers 133 and 136 from being doped.

Figure 6:
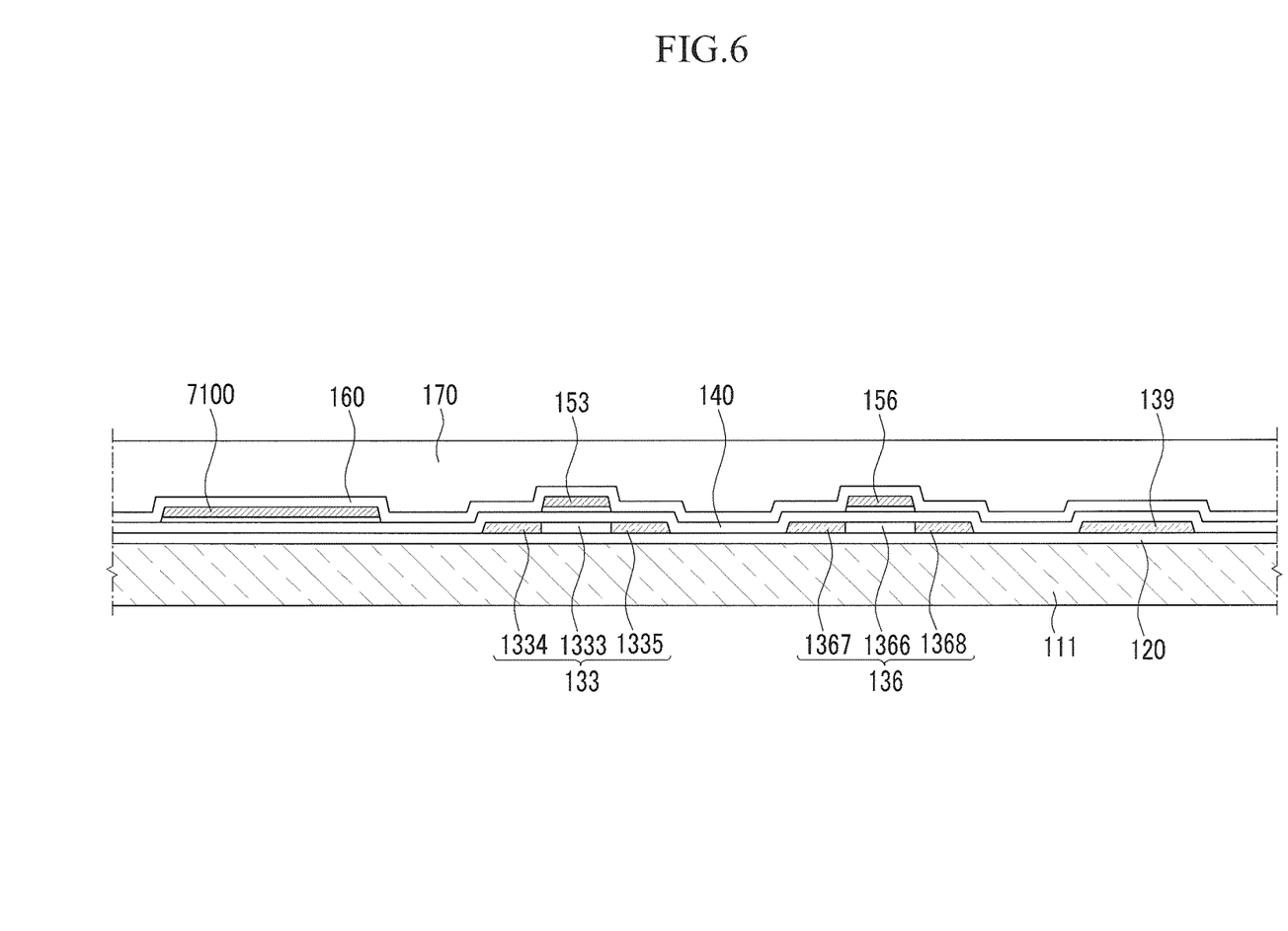

Referring to FIG. 6, the inorganic insulating layer 160 is formed on the gate electrodes 153 and 156 and the pixel electrode intermediate body 7100. The inorganic insulating layer 160 includes at least one of a silicon nitride film and a silicon oxide film. That is, the inorganic insulating layer 160 may be formed in a single-layer structure including the silicon nitride film or silicon oxide film, or in a multi-layer structure in which the silicon nitride film and silicon oxide film are laminated. In addition, the inorganic insulating layer 160 contains hydrogen.

For example, the inorganic insulating layer 160 may include a silicon nitride film formed through plasma enhanced chemical vapor deposition (PECVD) using silane, ammonia, and hydrogen. The silicon nitride film formed in this manner contains hydrogen that improves annealing effect on the semiconductor layers 133 and 136, which will be described later.

Then, an annealing process is performed to cure crystal defects in the semiconductor layers 133 and 136. The annealing process includes heat treatment performed at a temperature higher than 250° C. The crystal defects in the semiconductor layers 133 and 136 can be cured most effectively when heat treatment is carried out at 400° C.

If the inorganic insulating layer 160 is omitted and the annealing process is performed while the organic insulating layer 170 is formed on the gate electrodes 153 and 156, it is difficult to perform the annealing process at a temperature higher than 250° C. This is because the organic insulating layer 170 is carbonized and damaged when heat of higher than 230° C. is applied thereto.

In the first exemplary embodiment, however, the annealing process can be performed at an optimum temperature because the inorganic insulating layer 160 is directly formed on the gate electrodes 153 and 156 and the annealing process is carried out.

Furthermore, the inorganic insulating layer 160 such as a silicon nitride film contains much more hydrogen than the organic insulating layer 170, and thus the annealing process can be performed on the semiconductor layers 133 and 136 more effectively when the inorganic insulating layer 160 is formed.

Figure 7:
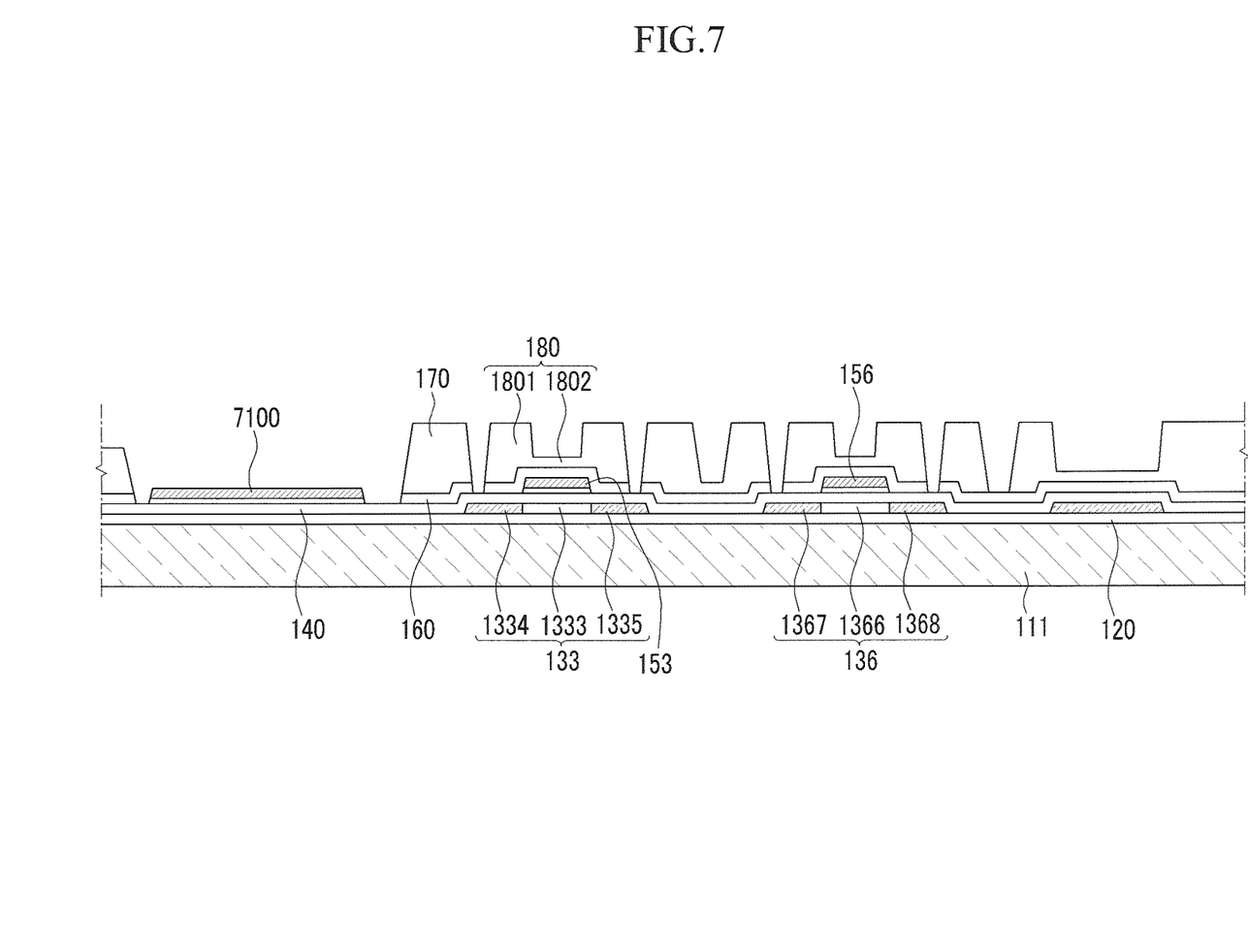

The organic insulating layer 170 is formed on the inorganic insulating layer 160 (S140), and then portions of the organic insulating layer 170 and the inorganic insulating layer 160, at which the plurality of contact holes 7644, 7645, 7647, and 7648 (shown in FIG. 8) will be formed, are selectively removed through photolithography using halftone exposure, as shown in FIG. 7. Furthermore, portions of the organic insulating layer 170 and inorganic insulating layer 160, disposed on the pixel electrode intermediate body 7100, are removed to expose the pixel electrode intermediate body 7100. In addition, portions of the organic insulating layer 170, in which the open groove 7080 will be formed, are removed such that parts of the portions of the organic insulating layer 170 are left. That is, the portions of the organic insulating layer 170 in which the open groove 7080 will be formed are not completely removed, and parts of the portions of the organic insulating layer 170 are left. Here, a portion of the organic insulating layer 170, in which the capacitor opening 7090 (shown in FIG. 8) will be formed on the first capacitor electrode 139, is also removed, such that part of the portion of the organic insulating layer 170 is left (S150).

Subsequently, portions of the gate insulating layer 140, at which the plurality of contact holes 7644, 7645, 7647, and 7648 will be formed, are removed through a wet etching process. The wet etching process uses plasma etching having directivity. The wet etching process uses a gas containing a fluorine component, such as C4F8, SF6, or CF4. Here, the portions of the organic insulating layer 170, which are left in the regions where the open groove 7080 and the capacitor opening 7090 will be formed, protect the inorganic insulating layer 160 from being removed and damaged during the process of etching the gate insulating layer 140. This can be achieved because the organic insulating layer 170 and the gate insulating layer 140 have different etching selectivities. The inorganic insulating layer 160 has etching selectivity similar or equal to that of the gate insulating layer 140. Accordingly, the inorganic insulating layer 160 may be also etched or damaged when the gate insulating layer 140 is etched if the remaining portions of the organic insulting layer 170 do not exist.

Figure 8:
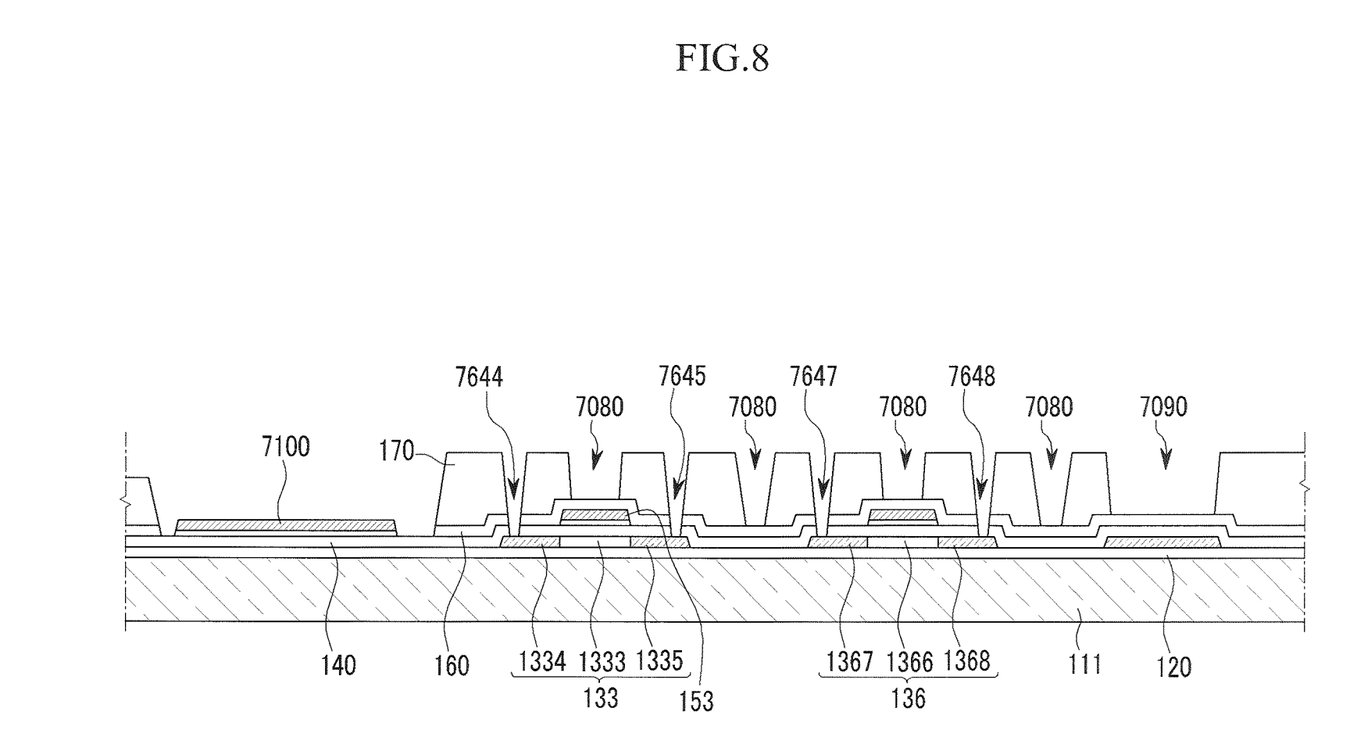

Referring to FIG. 8, the portions of the organic insulating layer 170, which are left in the regions where the open groove 7080 and the capacitor opening 7090 will be formed, are removed through ashing to accomplish the open groove 7080 and the capacitor opening 7090.

Figure 9:
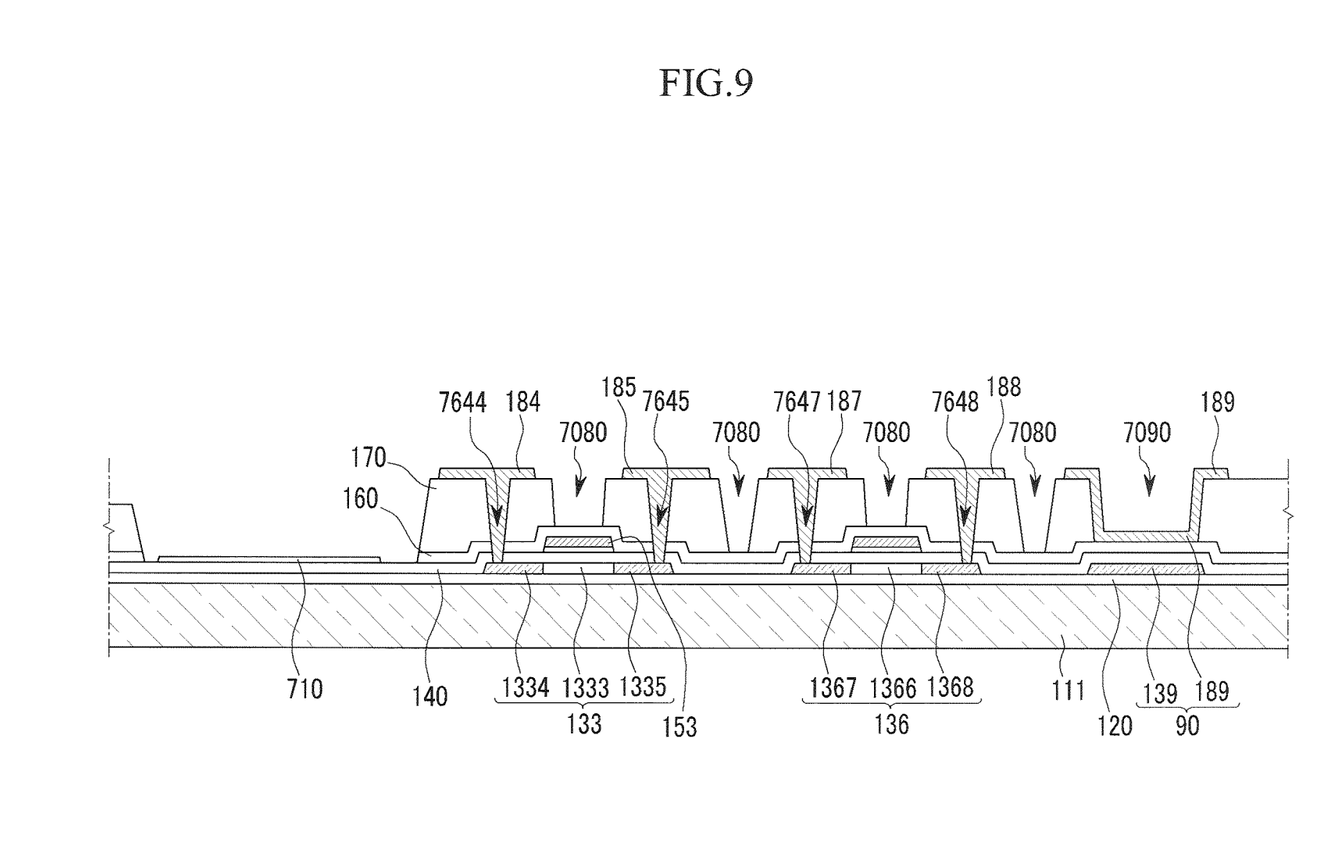

Referring to FIG. 9, the gate metal layer of the pixel electrode intermediate body 7100 is removed so as to form the pixel electrode 710. The plurality of conductive wires 184, 185, 187, 188, and 189 are formed on the organic insulating layer 170 (S160). The conductive wires 184, 185, 187 and 188 cover the contact holes 7644, 7645, 7647 and 7648, respectively. The conductive wire 189, which is the second capacitor electrode 189, covers the capacitor opening 7090. Some of the conductive wires are the source electrodes 184 and 187, and another some of the conductive wires are the drain electrodes 185 and 188. Still another some of the conductive wires are the second capacitor electrode 189.

The source electrodes 184 and 187 and the drain electrodes 185 and 188 respectively come into contact with the source regions 1334 and 1367 and the drain regions 1335 and 1368 of the semiconductor layers 133 and 136 through the plurality of contact holes 7644, 7645, 7647, and 7648.

As described above with reference to FIG. 3, the pixel-defining layer 190 having the pixel opening 195 that exposes the pixel electrode 710 is formed. The organic emission layer 720 and the common electrode 730 are sequentially formed on the pixel electrode 710 exposed through the pixel opening 195.

Subsequently, an opposite substrate 210 is arranged to cover the OLED 70.

The display device 101 according to the first exemplary embodiment can be effectively manufactured through the aforementioned manufacturing method. The display device 101 can stably prevent internal short-circuit and the semiconductor layers 133 and 136 of the thin film transistors 10 and 20 used for the display device 101 can be effectively annealed.

A display device 102 according to a second exemplary embodiment will now be explained with reference to FIG. 10.

Figure 10:
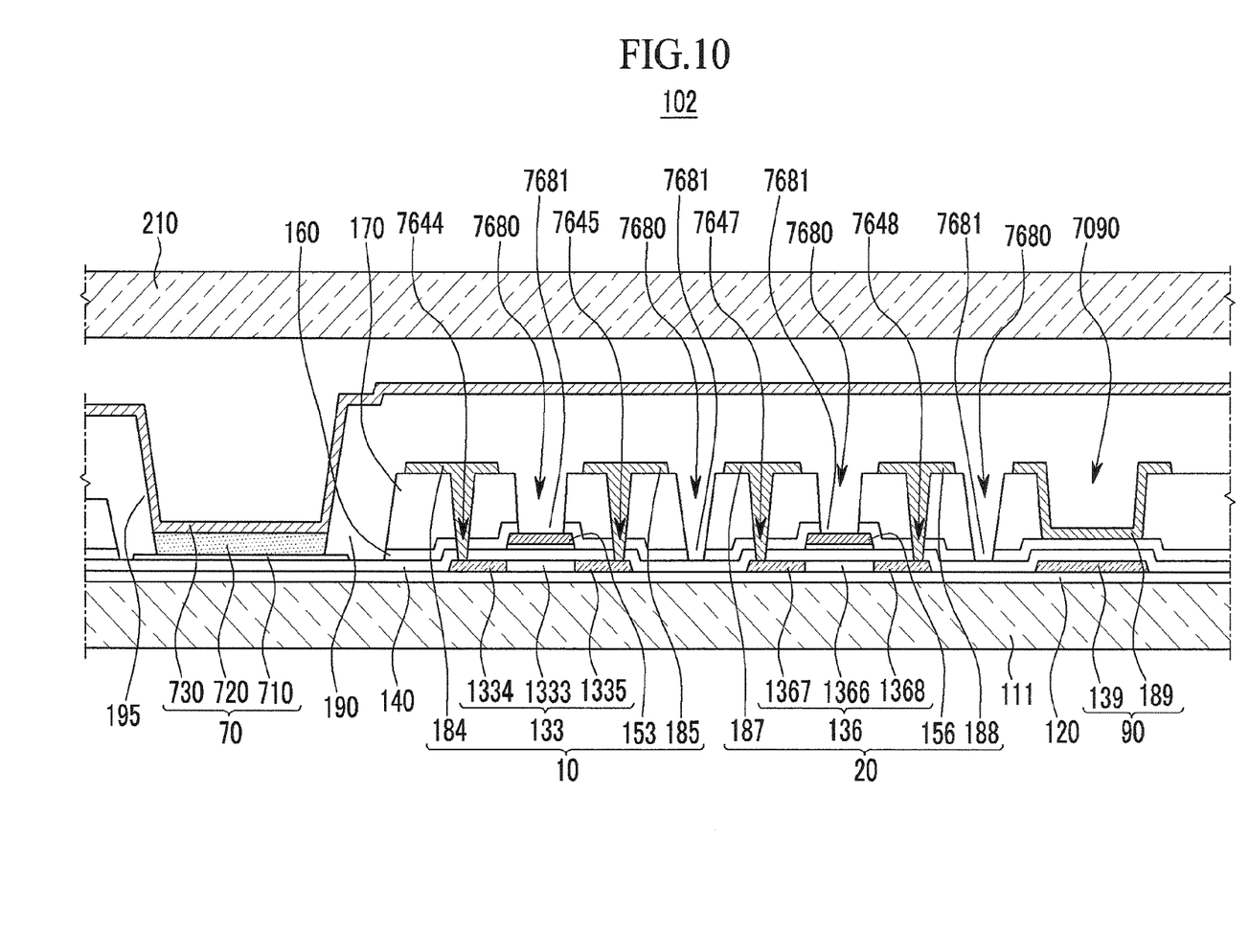
FIG. 10 is a cross-sectional view showing the structure of a display device according to a second exemplary embodiment.

As shown in FIG. 10, in the display device 102 according to the second exemplary embodiment, an open groove 7681 is formed in the inorganic insulating layer 160 and an open groove 7680 is formed in the organic insulating layer 170. The open grooves 7680 and 7681 are aligned together to expose the gate insulating layer 140 or the gate electrodes 153 and 156. That is, the combined open grooves 7680 and 7681 can have an increased depth. Accordingly, the open grooves 7680 and 7681 can stably insulate the conductive wires 184, 185, 187, 188, and 189.

According to the above-described configuration, the display device 102 can stably prevent an internal short-circuit, and the semiconductor layers 133 and 136 of the thin film transistors 10 and 20 used for the display device 102 can be effectively annealed.

A method for manufacturing the display device 103 according to the second exemplary embodiment is substantially identical to the method of manufacturing the display device 101 according to the first exemplary embodiment except that the open groove 7681 is formed in the inorganic insulating layer 160, and the open grooves 7680 and 7681 are aligned together to expose the gate insulating layer 140 or the gate electrodes 153 and 156. During the process for forming the open grooves 7681 in the inorganic insulating layer 160, portions of the inorganic insulating layer 160, which covers the gate electrodes 153 and 156 are also removed.

Figure 11:
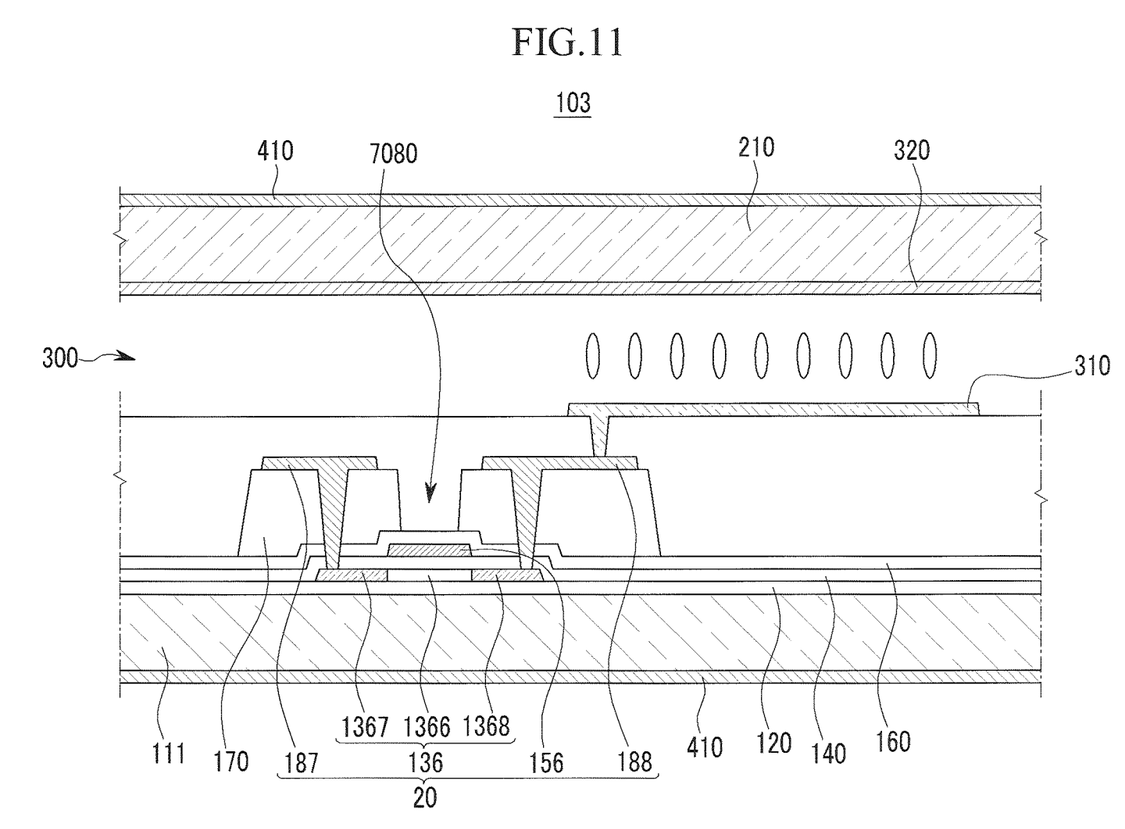
FIG. 11 is a cross-sectional view showing the structure of the display device according to the second embodiment.

A display device 103 according to a third exemplary embodiment will now be explained with reference to FIG. 11.

Figure 3:
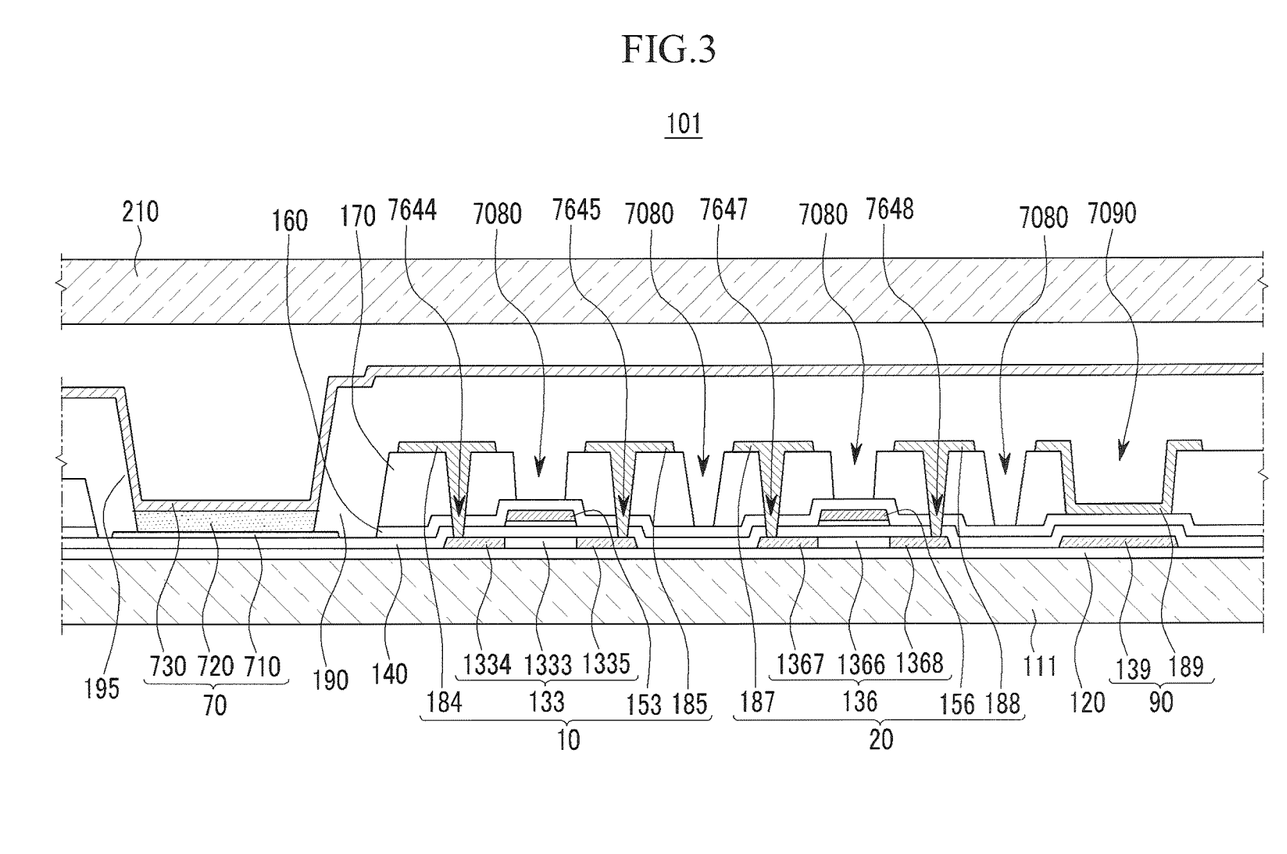
FIG. 3 is a cross-sectional view showing a thin film transistor, a capacitor, and an organic light emitting diode shown in FIG. 2.

The display device 103 according to the third exemplary embodiment includes a liquid crystal layer 300 instead of the OLED 70 shown in FIG. 3. Specifically, the display device 103 includes a pixel electrode 310 connected to the drain electrode 188 of the thin film transistor 20, the liquid crystal layer 300 formed on the pixel electrode 310, and a common electrode 320 formed on the liquid crystal layer 300.

The liquid crystal layer 300 may include various known liquid crystal materials.

In addition, the display device 103 further includes the opposite substrate 210 disposed facing the substrate 111 with the liquid crystal layer 300 interposed between the substrate 111 and the opposite substrate 210. The common electrode 320 is formed on an inner surface of the opposite substrate 210.

Furthermore, the display device 103 may further include polarizing plates 410 and 420 respectively bonded to outer surfaces of the substrate 111 and the opposite substrate 210.

The inorganic insulating layer 160 is formed on the gate electrode and the organic insulating layer 170 is formed on the inorganic insulating layer 160 as in the first exemplary embodiment. A plurality of conductive wires including the source electrode 187 and the drain electrode 188 are formed on the organic insulating layer 170.

The open groove 7080 is formed in the organic insulating layer 170. The plurality of conductive wires 187 and 188 are disposed apart from each other having the open groove 7080 formed between the conductive wires. That is, the open groove 7080 surrounds the plurality of conductive wires 187 and 188 and insulates the conductive wires 187 and 188.

However, the third exemplary embodiment is not limited thereto. The open groove 7080 may be formed in both the organic insulating layer 170 and the inorganic insulating layer 160, as in the second exemplary embodiment.

According to the aforementioned configuration, the display device 103 that displays images by driving liquid crystal can stably prevent an internal short-circuit, and the semiconductor layer 136 of the thin film transistor 20 used for the display device 103 can be effectively annealed.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a semiconductor layer formed on the substrate;
   an organic insulating layer formed on the semiconductor layer, the organic insulating layer having an open groove that overlaps with a channel region of the semiconductor layer; and
   a plurality of conductive wires formed on the organic insulating layer, the open groove formed between the conductive wires.

2. The display device of claim 1, wherein the plurality of conductive wires are disposed apart from each other having the open groove formed therebetween.

3. The display device of claim 1, further comprising:
   a gate insulating layer formed on the semiconductor layer; and
   a gate electrode formed on the gate insulating layer.

4. The display device of claim 3, further comprising an inorganic insulating layer disposed between the organic insulating layer and the gate electrode.

5. The display device of claim 4, wherein the inorganic insulating layer having an open groove, the open groove of the organic insulating layer and the open groove of the inorganic insulating layer being aligned together to expose the gate insulating layer or the gate electrodes.

6. The display device of claim 4, wherein the inorganic insulating layer includes a silicon nitride film containing hydrogen.

7. The display device of claim 3, further comprising:
   a pixel electrode formed on the gate insulating layer, the pixel electrode being coupled to a drain region of the semiconductor layer;
   an organic emission layer formed on the pixel electrode; and
   a common electrode formed on the organic emission layer.

8. The display device of claim 3, further comprising:
   a pixel electrode formed on the gate insulating layer, the pixel electrode being coupled to a drain region of the semiconductor layer;
   a liquid crystal layer formed on the pixel electrode; and
   a common electrode formed on the liquid crystal layer.

9. The display device of claim 3, wherein the gate electrode is formed in a double-layer structure including a gate transparent layer and a gate metal layer formed on the gate transparent layer, and the pixel electrode is formed of the same material as the gate transparent layer of the gate electrode on the same level as the gate transparent layer.

10. The display device of claim 1, wherein the semiconductor layer is formed by patterning a polysilicon layer.

11. The display device of claim 1, wherein one of the conductive wires is a source electrode connected to a source region of the semiconductor layer, and another of the conductive wires is a drain electrode connected to a drain region of the semiconductor layer.

12. The display device of claim 11, further comprising:
    a first capacitor electrode formed on the substrate, the first capacitor electrode being at substantially the same level as the semiconductor layer; and a second capacitor electrode formed on the gate insulating layer, the second capacitor electrode being at substantially the same level as the source electrode and the drain electrode.

13. A method for manufacturing a display device, comprising:
preparing a substrate;
forming a semiconductor layer on the substrate;
forming an organic insulating layer on the semiconductor layer;
forming an open groove on the organic insulating layer, the open groove overlapping with a channel region of the semiconductor layer; and
forming a plurality of conductive wires on the organic insulating layer, the conductive wires being disposed apart from each other having the open groove formed between the conductive wires.

14. The method of claim 13, further comprising:
forming a gate insulating layer on the semiconductor layer: and
forming a gate electrode on the gate insulating layer, the organic insulating layer being formed on the gate electrode.

15. The method of claim 14, wherein the conductive wires include a source electrode and a drain electrode.

16. The method of claim 15, further comprising:
forming a first capacitor electrode on the substrate substantially at the same level as the semiconductor layer, the conductive wires including a second capacitor electrode formed substantially at the same level as the source electrode and the drain electrode.

17. The method of claim 14, further comprising forming an inorganic insulating layer between the gate electrode and the organic insulating layer.

18. The method of claim 17, the forming the open groove on the organic insulating layer further comprising:
forming a contact hole on each of the organic insulating layer, the inorganic insulating layer, and the gate insulating layer, the contact holes of the organic insulating layer, the inorganic insulating layer, and the gate insulating layer being aligned together to expose a portion of the semiconductor layer.

19. The method of claim 18, the forming the contact hole on each of the organic insulating layer, the inorganic insulating layer, and the gate insulating layer further comprising:
removing portions of the organic insulating layer and inorganic insulating layer, at which the plurality of contact holes will be formed;
removing parts of portions of the organic insulating layer in which the open groove will be formed through photolithography using halftone exposure;
removing portions of the gate insulating layer at which the plurality of contact holes will be formed through an etching process to expose the semiconductor layer; and
removing portions of the organic insulating layer that are left in the regions where the open groove will be formed.

20. The method of claim 17, the forming the open groove comprising patterning the organic insulating layer and the inorganic insulating layer together.

21. The method of claim 17, wherein the inorganic insulating layer includes at least one of a silicon nitride film and a silicon oxide film.

22. The method of claim 17, wherein the inorganic insulating layer includes a silicon nitride film formed through plasma enhanced chemical vapor deposition (PECVD) using silane, ammonia, and hydrogen.

23. The method of claim 17, further comprising annealing after the inorganic insulating layer is formed on the gate electrode.

24. The method of claim 23, wherein the annealing comprises heat treatment performed at a temperature higher than 250° C.

* * * * *